United States Patent
Karasawa et al.

(10) Patent No.: US 7,031,180 B2
(45) Date of Patent: Apr. 18, 2006

(54) METHOD OF READING DATA IN FERROELECTRIC MEMORY DEVICE AND FERROELECTRIC MEMORY DEVICE

(75) Inventors: Junichi Karasawa, Shimosuwa-machi (JP); Takeshi Kijima, Matsumoto (JP); Eiji Natori, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/807,355

(22) Filed: Mar. 24, 2004

(65) Prior Publication Data

US 2004/0240250 A1    Dec. 2, 2004

(30) Foreign Application Priority Data

Mar. 28, 2003    (JP) ................................ 2003-091714

(51) Int. Cl.
*G11C 11/22*    (2006.01)
(52) U.S. Cl. ........................................ 365/145; 365/149
(58) Field of Classification Search ................ 365/145, 365/149
See application file for complete search history.

(56) References Cited

U.S. PATENT DOCUMENTS

| 6,545,933 B1* | 4/2003 | Sekiguchi et al. ...... 365/230.03 |
| 6,614,678 B1* | 9/2003 | Kato et al. ................... 365/145 |
| 6,901,002 B1* | 5/2005 | Matsushita ................... 365/145 |
| 2003/0223266 A1 | 12/2003 | Yamamura et al. |

FOREIGN PATENT DOCUMENTS

JP    A 9-116107    5/1997

* cited by examiner

*Primary Examiner*—Anh Phung
*Assistant Examiner*—Hien Nguyen
(74) *Attorney, Agent, or Firm*—Oliff & Berridge PLC (57) ABSTRACT

A method of reading data in a ferroelectric memory device includes applying a read voltage to a ferroelectric capacitor, and detecting a voltage that reflects an amount of a dynamic change in capacitance of the ferroelectric capacitor to which the read voltage is applied. Since a voltage difference $\Delta V$ occurs at a time T between the case where the polarization of a memory cell which has stored first data is not reversed and the case where the polarization of a memory cell which has stored second data is reversed, a read margin increases.

12 Claims, 8 Drawing Sheets

METHOD OF READING DATA IN FERROELECTRIC MEMORY DEVICE AND FERROELECTRIC MEMORY DEVICE

Japanese Patent Application No. 2003-91714, filed on Mar. 28, 2003 is hereby incorporated by reference in its entirety.

BACKGROUND OF THE INVENTION

The present invention relates to a ferroelectric memory device.

As a ferroelectric memory device, an active ferroelectric memory device including 1T/1C cells in which one transistor and one ferroelectric capacitor are disposed in each memory cell, or including 2T/2C cells in which a reference cell is further disposed in each memory cell, has been known. As a nonvolatile memory device which is more suitable for an increase in capacity, a ferroelectric memory device in which each memory cell is formed by one ferroelectric capacitor has been proposed (Japanese Patent Application Laid-open No. 9-116107).

In a conventional ferroelectric memory device, data is read by detecting the change in the amount of charge which occurs when applying a read voltage to the ferroelectric capacitor. This method of reading data is easily influenced by variation of characteristics of the ferroelectric capacitor in each memory cell, since a read margin is comparatively small.

BRIEF SUMMARY OF THE INVENTION

The present invention may provide a method of reading data in a ferroelectric memory device enabling a stable operation by increasing the data read margin and a ferroelectric memory device.

A method of reading data in a ferroelectric memory device according to one aspect of the present invention includes:

applying a read voltage to a ferroelectric capacitor; and
detecting a voltage that reflects an amount of a dynamic change in capacitance of the ferroelectric capacitor to which the read voltage is applied.

In one aspect of the present invention, the voltage which reflects the dynamic change in the capacitance of the ferroelectric capacitor is detected instead of detecting the change in the amount of charge of the ferroelectric capacitor which occurs when applying the read voltage, as in a conventional method.

A ferroelectric memory device according to another aspect of the present invention can implement the above method of reading data in a ferroelectric memory device.

In the above method, the ferroelectric capacitor may store one of first data (data "0", for example) and second data (data "1", for example), the first data being stored based on spontaneous polarization of a first polarity (a point B in FIG. 1, for example) when a voltage applied to the ferroelectric capacitor is returned from a write voltage of the first polarity to 0 V, the second data being stored based on spontaneous polarization of a second polarity (a point D in FIG. 1, for example) when the voltage applied to the ferroelectric capacitor is returned from a write voltage of the second polarity to 0 V.

Polarity of polarization of the ferroelectric capacitor which has stored the first data may not be reversed and polarity of polarization of the ferroelectric capacitor which has stored the second data may be reversed (in FIG. 1, reversed from negative to positive), when a voltage of the first polarity (+$V_s$ in FIG. 1, for example) is applied to the ferroelectric capacitor as the read voltage. Therefore, the dynamic change in capacitance of the ferroelectric capacitor is greater in the case that the polarity is reversed.

Figure 3:
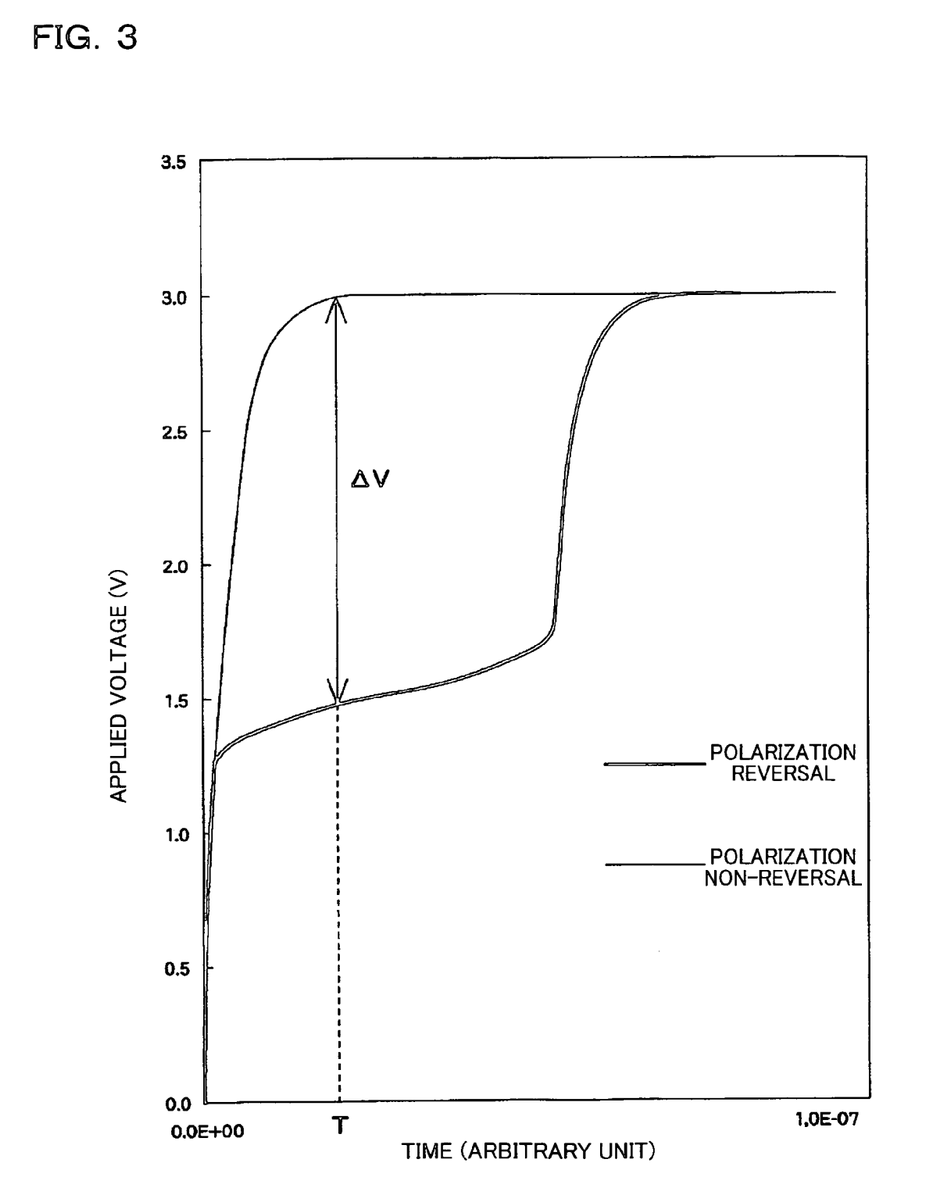
FIG. 3 shows voltage rise characteristics of voltage applied to the ferroelectric capacitor shown in FIG. 2 in the case where polarization is reversed and the case where polarization is not reversed.
Figure 6:
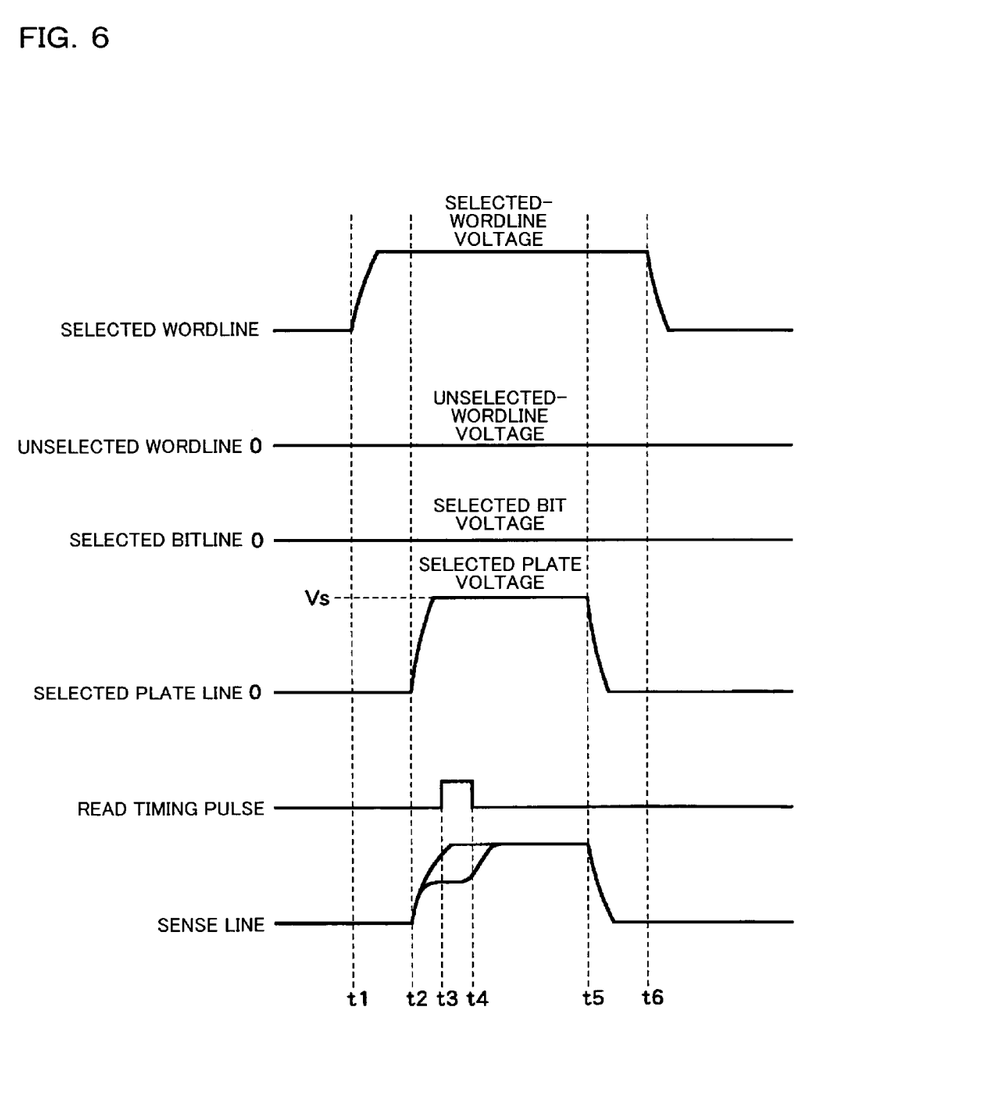
FIG. 6 is a timing chart illustrating a data read operation in the memory device shown in FIG. 5.

More specifically, a voltage-rise curve may include a portion in which a voltage-rise gradient differs depending on whether a polarization value of the ferroelectric capacitor is a first value or a second value, the voltage-rise curve indicating a voltage rise of a sense line connected with the ferroelectric capacitor when the read voltage is applied to the ferroelectric capacitor, and a timing of detecting the voltage that reflects the amount of the dynamic change may be set in a period specified by the portion in which the voltage-rise gradient differs (a time T in FIG. 3 or period between a time t3 and a time t4 in FIG. 6, for example).

Figure 1:
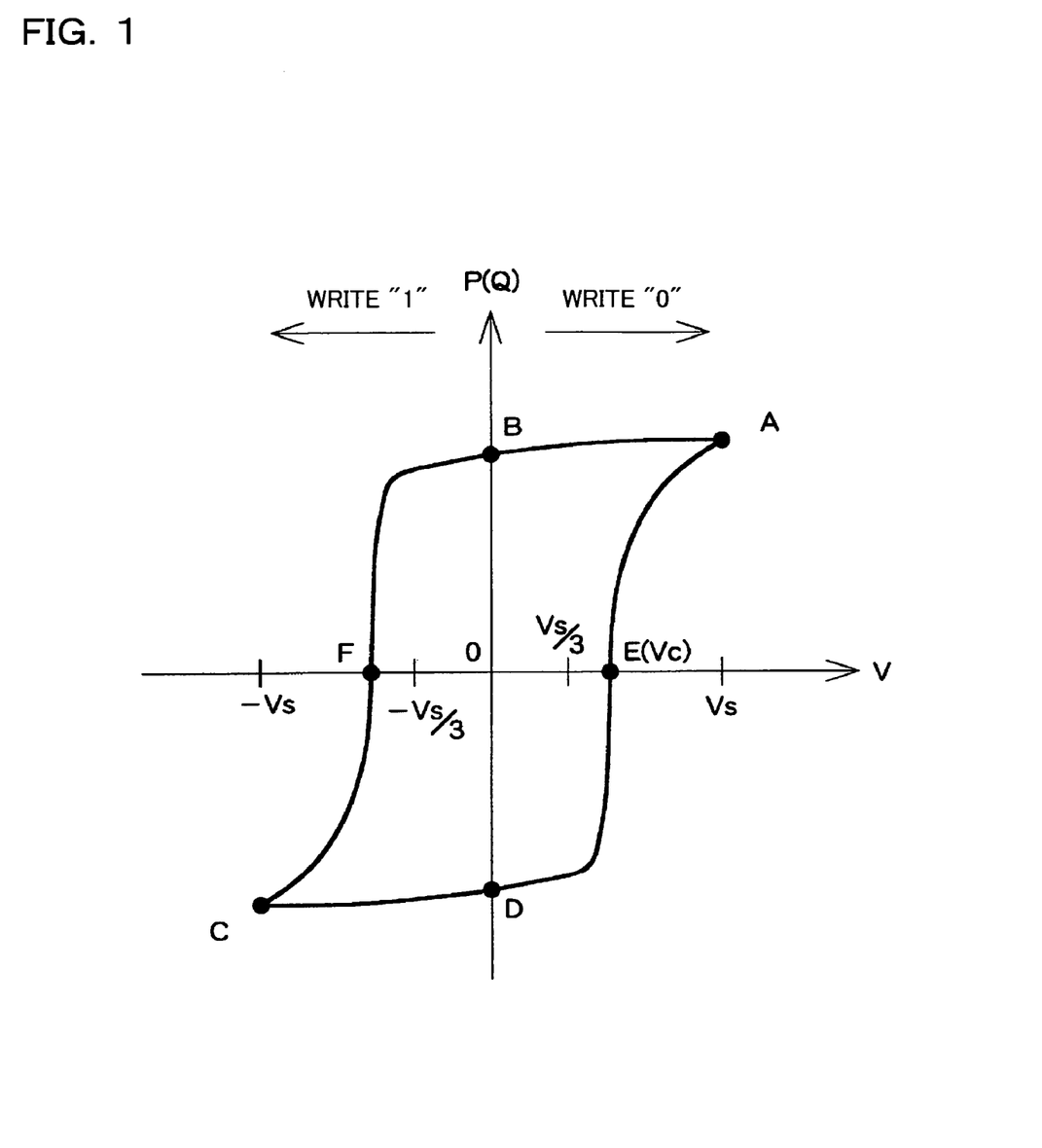
FIG. 1 shows hysteresis characteristics of ferroelectrics.

A timing for the reading may be set around a time at which the polarization of the ferroelectric capacitor becomes zero in a hysteresis characteristic between polarization and an applied voltage of the ferroelectric capacitor (shown in FIG. 1, for example) when the read voltage is applied to the ferroelectric capacitor which has stored the second data (a point D in FIG. 1, for example).

A ferroelectric memory device according to a further aspect of the present invention includes:

a plurality of memory cells, each of the memory cells including a ferroelectric capacitor and a switching element;

a plurality of wordlines, each of the wordlines extending in a first direction and being connected in common with a control terminal of the switching element in each of the memory cells arranged along the first direction;

a plurality of bitlines, each of the bitlines extending in a second direction and being connected in common with one end of the switching element in each of the memory cells arranged along the second direction, the second direction intersecting the first direction;

a plurality of sense lines, each of the sense lines extending in the second direction and being connected in common with one end of the ferroelectric capacitor and the other end of the switching element in each of the memory cells arranged in the second direction;

a plurality of plate lines, each of the plate lines extending in the first direction and being connected in common with the other end of the ferroelectric capacitor in each of the memory cells arranged in the first direction; and a voltage detection section which detects a voltage of the sense lines in a specified period, when a read voltage is applied to the ferroelectric capacitor of at least one selected memory cell selected from among the plurality of memory cells, the specified period being specified by a portion of a voltage-rise curve in which a voltage-rise gradient differs depending on whether a polarization value of the ferroelectric capacitor is a first value or a second value, and the voltage-rise curve indicating a voltage rise of one of the sense lines connected with the ferroelectric capacitor of the selected memory cell.

This ferroelectric memory device may further include a read timing generation device which generates a timing signal for setting a period for detecting the voltage of the sense lines. The voltage detection section may include a plurality of sense amplifiers connected with the sense lines. The read timing generation device may activate the sense amplifiers by outputting the timing signal to the sense amplifiers.

In this ferroelectric memory device, when reading or writing data, the switching element in the selected memory cell may be turned on by applying a selected-wordline voltage to a selected wordline which is a wordline among the plurality of the wordlines and to be used for selecting the selected memory cell, and the switching element in an unselected memory cell among the plurality of the memory cells may be turned off by applying an unselected-wordline voltage to an unselected wordline which is a wordline other than the selected wordline among the plurality of the wordlines. A read plate-line voltage or a write plate-line voltage may be applied to a selected plate line which is a plate line among the plurality of the plate lines and connected with the selected memory cell, and an unselected plate line, which is a plate line other than the selected plate line among the plurality of the plate lines, may be set in a floating state.

When reading data, a read bitline voltage may be applied to a selected bitline which is a bitline among the plurality of bitlines and connected with the selected memory cell, and an unselected-bitline voltage may be applied to an unselected bitline which is a bitline other than the selected bitline among the plurality of the bitlines.

When writing data "1", a data "1" write bitline voltage may be applied to a selected bitline which is a bitline among the plurality of bitlines and connected with the selected memory cell, an unselected-bitline voltage may be applied to an unselected bitline which is a bitline other than the selected bitline among the plurality of the bitlines, and a data "1" write plate-line voltage may be applied to the selected plate line.

When writing data "0", a data "0" write bitline voltage may be applied to a selected bitline which is a bitline among the plurality of bitlines and connected with the selected memory cell, an unselected-bitline voltage may be applied to an unselected bitline which is a bitline other than the selected bitline among the plurality of the bitlines, and a data "0" write plate-line voltage may be applied to the selected plate line.

Each of the sense amplifiers activated for a predetermined period of time by the timing signal may compare a cell voltage from one of the sense lines with a reference voltage.

DETAILED DESCRIPTION OF THE EMBODIMENT

An embodiment of the present invention is described below with reference to the drawings.

1. General Operation

A ferroelectric memory device (hereinafter may be called "FeRAM") is a nonvolatile memory device utilizing a hysteresis phenomenon of ferroelectrics. The hysteresis phenomenon is described below. FIG. 1 shows the correlation between voltage applied to a ferroelectric and polarization of the ferroelectric. The vertical axis P (Q) in FIG. 1 indicates the polarization (amount of charge) of the ferroelectric, and the horizontal axis V indicates the voltage applied to the ferroelectric. The ferroelectric having a hysteresis curve as shown in FIG. 1 has a property of retaining the polarization state even if the voltage applied to the ferroelectric is set at 0 V (hereinafter may be called "spontaneous polarization"). The spontaneous polarization has two polarization states depending on whether the voltage applied to the ferroelectric is positive or negative. The ferroelectric can be utilized as a storage medium of a memory device by allowing one of the two polarization states to correspond to "0" and the other polarization state to correspond to "1". Writing of data "0" and writing of data "1" are defined as shown in FIG. 1. Therefore, in the present embodiment, a point B in FIG. 1 is a memory state of data "0" and a point D in FIG. 1 is a memory state of data "1".

When writing data "0", a write voltage (voltage Vs, for example) is applied to the ferroelectric capacitor. This causes the polarization of the ferroelectric capacitor to move from the point B or D to a point A in FIG. 1. After writing, the voltage applied to the ferroelectric capacitor is set at 0 V, whereby the polarization of the ferroelectric capacitor moves to the point B in FIG. 1.

When writing data "1", the write voltage (voltage –Vs, for example) is applied to the ferroelectric capacitor. This causes the polarization of the ferroelectric capacitor to move from the point B or D to a point C in FIG. 1. After writing, the voltage applied to the ferroelectric capacitor is set at 0 V, whereby the polarization of the ferroelectric capacitor moves to the point D in FIG. 1. This is the basic principle of the ferroelectric memory device.

2. Principle of Present Invention

The present invention is characterized by its data read operation. Data is read by applying a read voltage (voltage Vs, for example) to the ferroelectric capacitor in the same manner as in a conventional method. In this case, the polarization of the ferroelectric capacitor moves from the point B or D to the point A in FIG. 1.

In a conventional method, data "0" or data "1" is judged based on the change in the amount of charge when the polarization moves from the point B or D to the point A in FIG. 1.

The present invention utilizes a phenomenon in which the capacitance of the ferroelectric capacitor to which the read voltage is applied changes dynamically, and judges data "0" or data "1" by detecting the voltage which reflects the amount of the dynamic change.

The ferroelectric capacitor stores first data which is stored based on spontaneous polarization of a first polarity when the voltage applied to the ferroelectric capacitor is returned from a write voltage of the first polarity (+Vs, for example) to 0 V (data "0" at the point B in FIG. 1), or second data which is stored based on spontaneous polarization of a second polarity when the voltage applied to the ferroelectric capacitor is returned from a write voltage of the second polarity (–Vs, for example) to 0 V (data "1" at the point D in FIG. 1).

When voltage of the first polarity (+Vs in FIG. 1) is applied to the ferroelectric capacitor as the read voltage, the polarization of the ferroelectric capacitor which has stored the first data (data "0" at the point B in FIG. 1) moves from the point B to the point A in FIG. 1. In this case, the polarity of the polarization of the ferroelectric capacitor remains positive and is not reversed (hereinafter called "polarization non-reversal").

When voltage of the first polarity (+Vs in FIG. 1) is applied to the ferroelectric capacitor as the read voltage, the polarization of the ferroelectric capacitor which has stored the second data (data "1" at the point D in FIG. 1) moves from the point D to the point A in FIG. 1. In this case, the polarity of the polarization of the ferroelectric capacitor is reversed from negative (point D) to positive (point A) (hereinafter called "polarization reversal").

Figure 2:
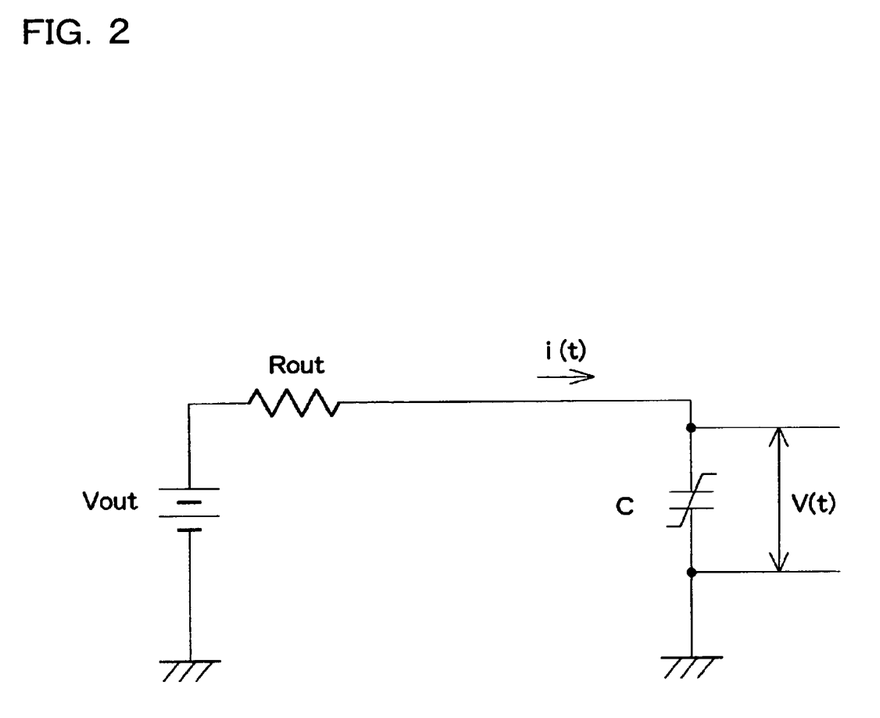
FIG. 2 is an equivalent circuit diagram of a circuit which applies voltage to a ferroelectric capacitor.

The voltage V(t) applied to the ferroelectric capacitor C is considered below with reference to an equivalent circuit shown in FIG. 2. As shown in FIG. 2, if an output voltage is indicated by $V_{out}$, an output resistance is indicated by $R_{out}$, and a current is indicated by i(t), the following equation is obtained.

$$V_{out} = R_{out} \times i(t) + V(t) \quad (1)$$

If the dynamic capacitance of the ferroelectric capacitor C is indicated by C(V(t)) and the amount of charge stored in the ferroelectric capacitor is indicated by Q(t), i(t) is expressed by the following equation (2).

$$i(t) = \frac{dQ(t)}{dt} \quad (2)$$
$$= \frac{dQ(t)}{dV} \cdot \frac{dV(t)}{dt}$$
$$= C(V(t)) \cdot \frac{dV(t)}{dt}$$

The following equation (3) is obtained from the equations (1) and (2).

$$V_{out} = R_{out} \cdot C(V) \cdot \frac{dV(t)}{dt} + V(t) \quad (3)$$

Transforming the equation (3) gives the following differential equation (4).

$$\frac{dV(t)}{dt} = \frac{V_{out} - V(t)}{R_{out} \cdot C(V(t))} \quad (4)$$

Therefore, the voltage V(t) applied to the ferroelectric capacitor C can be solved by numerical analysis by assuming the dynamic capacitance C(V) of the ferroelectric capacitor C with respect to the voltage V applied to the ferroelectric capacitor C, whereby the change in the voltage V(t) with time can be accurately calculated.

In the calculation example, the following simple models are assumed as the dynamic capacitance C(V) of the ferroelectric capacitor for convenience of calculation. The voltage region of 0 V or more is considered for convenience of calculation.

Polarization Non-reversal $$C(V) = \varepsilon_0 \cdot \varepsilon_{nsw} \cdot \frac{S}{d} \quad (0 \leq V) \quad (5)$$

Polarization Reversal $$C(V) = \varepsilon_0 \cdot \varepsilon_{nsw} \cdot \frac{S}{d} \quad (0 \leq V \leq Vc - \Delta) \quad (6)$$
$$= \varepsilon_0 \cdot \varepsilon_{nsw} \cdot \frac{S}{d} + \quad (Vc - \Delta \leq V \leq Vc)$$
$$\varepsilon_0 \cdot \varepsilon_{sw} \cdot (V - (Vc - \Delta)) \cdot \frac{S}{d}$$
$$= \varepsilon_0 \cdot \varepsilon_{nsw} \cdot \frac{S}{d} + \quad (Vc \leq V \leq Vc + \Delta)$$
$$\varepsilon_0 \cdot \varepsilon_{sw} \cdot ((Vc + \Delta) - V) \cdot \frac{S}{d}$$
$$= \varepsilon_0 \cdot \varepsilon_{nsw} \cdot \frac{S}{d} \quad (Vc + \Delta \leq V)$$

S represents the area of the ferroelectric capacitor C, d represents the film thickness of the ferroelectric capacitor, $\varepsilon_0$ represents the dielectric constant under vacuum, $\varepsilon_{nsw}$ represents the dynamic relative dielectric constant of the ferroelectric capacitor C in the case where the polarization is not reversed, $\varepsilon_{sw}$ represents the maximum value of the dynamic relative dielectric constant of the ferroelectric capacitor C in the case where the polarization is reversed, Vc represents the coercive voltage of the ferroelectric capacitor C, and $\Delta$ is an index indicating variation of polarization reversal. In the following calculation, it is assumed that $\varepsilon_{nsw}=500$, Psw=2Pr=$\varepsilon_0 \times \varepsilon_{sw} \times \Delta/d$=50 µC/cm², and Vc=1.5 V. $\varepsilon_{sw} \times \Delta$, which relates to 2Pr, is constant. Note that squareness of the hysteresis curve improves as $\varepsilon_{sw}$ is larger and $\Delta$ is smaller, and squareness of the hysteresis curve worsens as $\varepsilon_{sw}$ is smaller and $\Delta$ is larger.

FIG. 3 shows waveforms of the voltage V(t) applied to the ferroelectric capacitor C in the case where the polarization is reversed and the case where the polarization is not reversed, calculated by using the above equations. In FIG. 3, the read voltage Vs shown in FIG. 1 is set at 3 V.

As shown in FIG. 3, the voltage V(t) applied to the ferroelectric capacitor C is rapidly increased to Vs (=3 V) in the case where the polarization is not reversed. On the contrary, an increase in the applied voltage V(t) becomes slow at about the coercive voltage Vc (=1.5 V) in the case where the polarization is reversed. As described above, the voltage V(t) applied to the ferroelectric capacitor C significantly differs in voltage rise gradient between the case where the polarization is reversed and the case where the polarization is not reversed.

The reason therefor is because the dynamic capacitance of the ferroelectric capacitor C is small in the case where the polarization is not reversed, but is significantly increased in the case where the polarization is reversed, since the polarity is reversed across the coercive voltage.

In the period in which the rise gradient of the voltage V(t) applied to the ferroelectric capacitor C differs, such as a time T in FIG. 3, the voltage V(t) applied to the ferroelectric capacitor C has reached about the read voltage Vs (=3 V) in the case where the polarization is not reversed, and is at about the coercive voltage Vc (=1.5 V) in the case where the polarization is reversed.

Therefore, if the voltage V(t) applied to the ferroelectric capacitor C is detected at or near the time T in FIG. 3, whether the data is data in the case where the polarization is not reversed (data "0" at the point B in FIG. 1), or data in the case where the polarization reversed (data "1" at the point B in FIG. 1) can be judged. Moreover, since the detected voltage difference ΔV can be secured for the difference between the read voltage Vs and the coercive voltage Vc, a read margin can be sufficiently secured.

3. Relationship with Squareness of Hysteresis of Ferroelectric Capacitor

The read time which can secure the read margin can be sufficiently secured as the hysteresis characteristics of the ferroelectric capacitor shown in FIG. 1 are closer to square. The hysteresis characteristics are defined to have better squareness as the degree of horizontality of the upper and lower sides shown in FIG. 1 is higher and the degree of perpendicularity of the right and left sides is higher.

Figure 4:
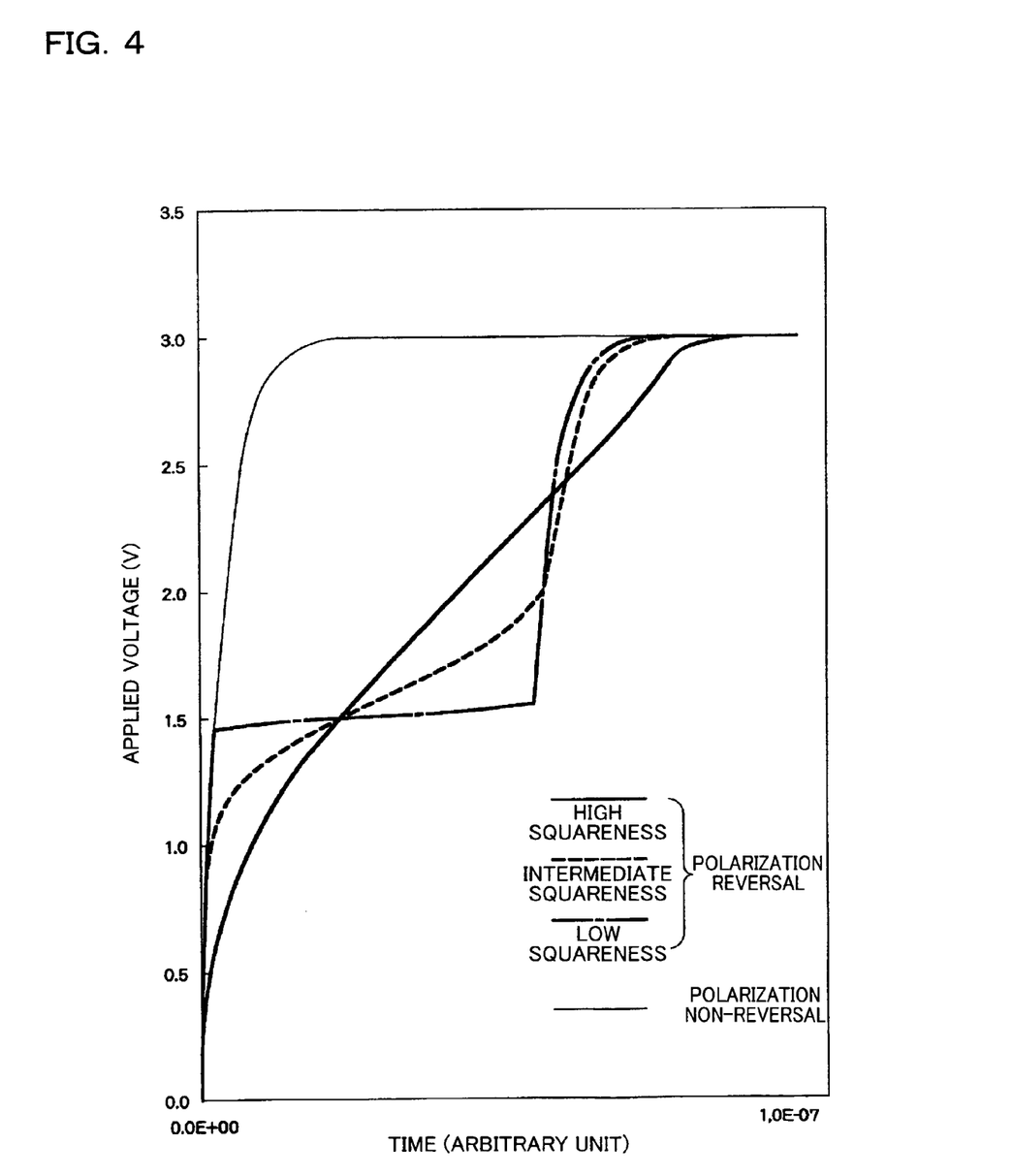
FIG. 4 shows correlation between voltage rise characteristics of voltage applied to a ferroelectric capacitor in the case where polarization is reversed and squareness of hysteresis characteristics.

FIG. 4 is a characteristic diagram showing the relationship between squareness and the voltage V(t) applied to the ferroelectric capacitor C in the case where the polarization is reversed. As shown in FIG. 4, the width of the detection time which can sufficiently secure the read margin is greater as the squareness is better.

4. Embodiment

An embodiment of a ferroelectric memory device which operates based on the above-described basic principle is described below. The following embodiment relates to a so-called 1T1C type ferroelectric memory device. However, the present invention can also be applied to other types of ferroelectric memory devices such as a 2T2C type or crosspoint type ferroelectric memory device.

Figure 5:
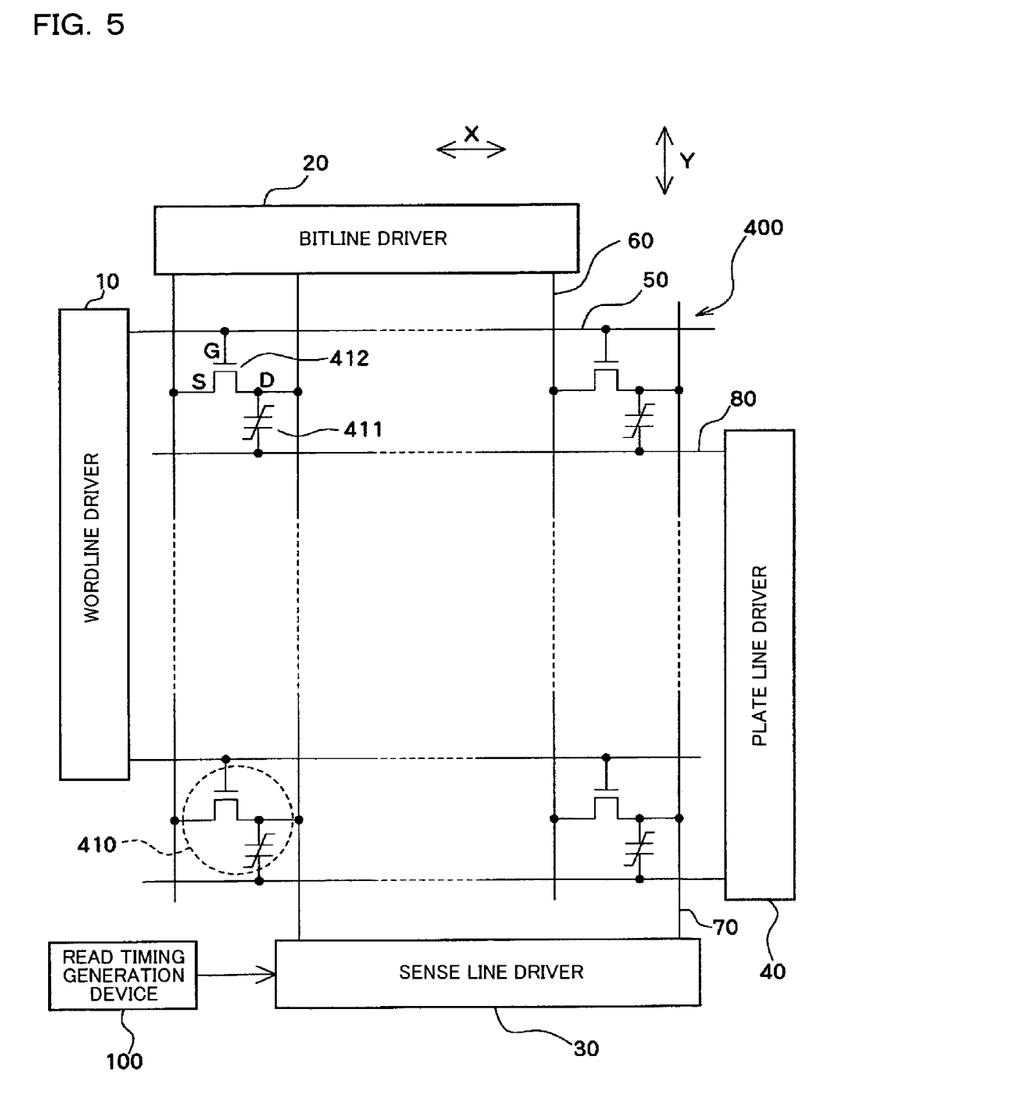
FIG. 5 is a block diagram of a ferroelectric memory device according to an embodiment of the present invention.

FIG. 5 is a schematic explanatory diagram of the memory device of the present embodiment. In a memory cell array 400, a plurality of wordlines 50 and a plurality of plate lines 80 are disposed in parallel. In the memory cell array 400, a plurality of bitlines 60 and a plurality of sense lines 70 are disposed in parallel so as to intersect the wordlines 50 and the plate lines 80. A plurality of memory cells 410 are disposed in the memory cell array 400 in the shape of a matrix. The memory cell 410 is connected with one of the wordlines 50, one of the bitlines 60, one of the sense lines 70, and one of the plate lines 80. One wordline 50 and one plate line 80 are connected in common with the memory cells 410 arranged along the row direction X. One bitline 60 and one sense line 70 are connected in common with the memory cells 410 arranged along the column direction Y.

The wordlines 50 are connected with a wordline driver section 10. The bitlines 60 are connected with a bitline driver section 20. The sense lines 70 are connected with a sense line driver section 30. The plate lines 80 are connected with a plate line driver section 40. The sense line driver section 30 is connected with a read timing generation device 100. The sense line driver section 30 activates a sense amplifier described later when receiving a signal from the read timing generation device 100.

The memory cell 410 includes one ferroelectric capacitor 411 and one access transistor 412 (switching element). A gate G of the access transistor 412 is connected with the corresponding wordline 50. A source S of the access transistor 412 is connected with the corresponding bitline 60. A drain D of the access transistor 412 is connected with the corresponding sense line 70 and one end of the ferroelectric capacitor 411. The other end of the ferroelectric capacitor 411 is connected with the corresponding plate line 80.

FIG. 6 shows various voltage waveforms when reading data from at least one selected memory cell 410 selected from among the memory cells 10 shown in FIG. 5. In the case of reading data from the memory cell 410 at the upper left end shown in FIG. 5, the wordline 50 and the plate line 80 in the first row from the top shown in FIG. 5 respectively become a selected wordline and a selected plate line, and the remaining wordlines 50 and the plate lines 80 respectively become unselected wordlines and unselected plate lines. The bitline 60 located in the first column from the left shown in FIG. 5 becomes a selected bitline.

When a selected-wordline voltage shown in FIG. 5 is applied to the selected wordline 50 in the first row, all the switching elements 412 in the memory cells 410 located in the first row are turned on. Since an unselected-wordline voltage shown in FIG. 5 is applied to the unselected wordlines 50 in the rows other than the first row, the switching elements 412 in the unselected memory cells 410 located in the rows other than the first row are turned off.

A selected-bitline voltage (0 V, for example) shown in FIG. 5 is applied to the selected bitline in the first column, and a selected-plate-line voltage (Vs, for example) is applied to the selected plate line in the first row. This causes the voltage V(t) shown in FIG. 2 to be applied to the ferroelectric capacitor 411 in the selected memory cell through the switching element 412.

The voltage V(t) applied to the ferroelectric capacitor in the selected memory cell differs in voltage rise characteristics between the case where the polarization is reversed and the case where the polarization is not reversed, as shown in FIG. 3. Therefore, the same voltage as the voltage shown in FIG. 3 is applied to the sense line 70 connected with the selected memory cell, as shown in FIG. 6.

The sense lines 70 are connected with the sense line driver section 30, as shown in FIG. 5. The sense line driver section 30 includes N sense amplifiers which can write/read at the same time. N is 8, 16, 32, etc. The sense line 70 connected with the selected memory cell is selectively connected with one of the N sense amplifiers in the same manner as in a conventional method.

In the present embodiment, the read timing generation device 100 which generates a timing signal for setting timing for detecting the voltage of the sense line 70 is further provided. The read timing generation device 100 outputs a read timing pulse shown in FIG. 6 to the N sense amplifiers. The N sense amplifiers are activated in the read period between a time t 3 and a time t 4 in FIG. 6 in which the read timing pulse is set at HIGH.

The voltage at the time T shown in FIG. 3 in the case where the polarization is not reversed is input to each sense amplifier as a reference voltage. Therefore, whether the cell voltage is the voltage in the case where the polarization is not reversed (data "0" at the point B in FIG. 1) or the voltage in the case where the polarization is reversed (data "1" at the point D in FIG. 1) can be judged by comparing the cell voltage from the selected memory cell with the reference voltage.

The unselected memory cells other than the selected memory cell are included in the first row shown in FIG. 4. Therefore, the unselected bitlines in the columns other than the first column are set at an unselected-bitline voltage (0 V, for example,) as shown in FIG. 6. As a result, 0 V can be applied to the ferroelectric capacitors 411 in the unselected memory cells in the first row.

All the switching elements 412 in the unselected memory cells in the second and subsequent rows are turned off. In the present embodiment, the unselected plate lines are set in a floating state by using the plate line driver section 40.

Figure 7:
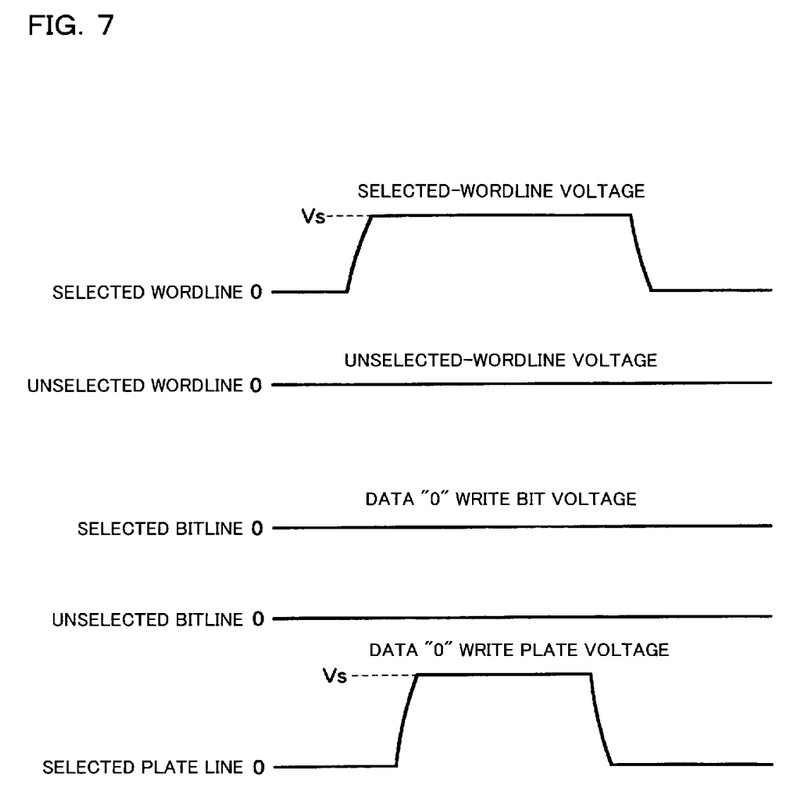
FIG. 7 is a timing chart illustrating a write operation of data "0" in the memory device shown in FIG. 5.
Figure 8:
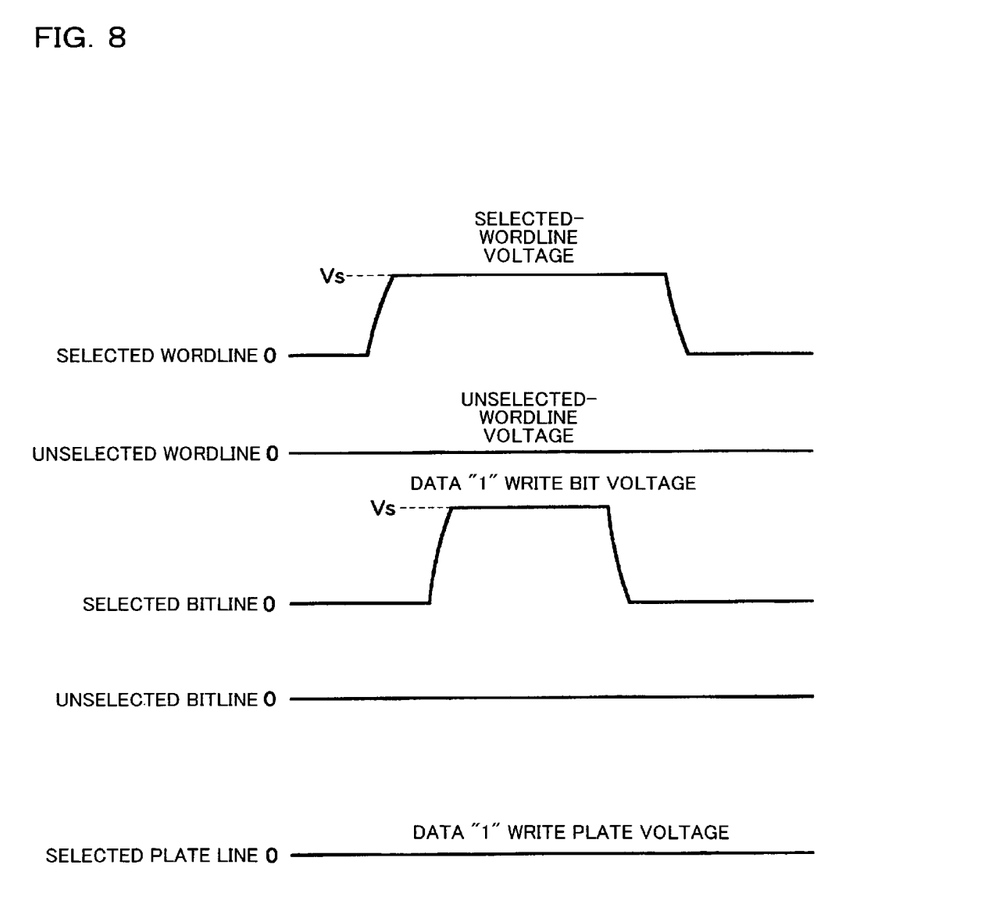
FIG. 8 is a timing chart illustrating a write operation of data "1" in the memory device shown in FIG. 5.

FIG. 7 shows the write operation of data "0", and FIG. 8 shows the write operation of data "1".

In the data write operation, the switching elements 412 in the memory cells 410 in the first row are turned on by applying the selected-wordline voltage to the selected wordline in the first row in the same manner as in the data read operation. The switching elements 412 in the unselected memory cells in the second and subsequent rows are turned off by applying the unselected-wordline voltage to the unselected wordlines in the second and subsequent rows. The unselected bitlines are set at the unselected-bitline voltage, and the unselected plate lines are set in a floating state.

The write operation of data "0" is substantially the same as the above-described data read operation except that data "0" is supplied from the sense line driver section 30. Therefore, a data "0" write bitline voltage (0 V, for example) is applied to the selected bitline, and a data "0" write plate-line voltage (Vs, for example) is applied to the selected plate line, as shown in FIG. 7. As a result, +Vs is applied to the ferroelectric capacitor in the selected memory cell, whereby data "0" is written as shown in FIG. 1.

In the write operation of data "1", the voltages applied to the selected bitline and the selected plate line in the write operation of data "0" are each replaced by the other. Specifically, a data "1" write bitline voltage (Vs, for example) is applied to the selected bitline, and a data "1" write plate-line voltage (0 V, for example) is applied to the selected plate line, as shown in FIG. 8. As a result, −Vs is applied to the ferroelectric capacitor in the selected memory cell, whereby data "1" is written as shown in FIG. 1.

The present invention is not limited to the above-described embodiment. Various modifications and variations are possible within the spirit and scope of the present invention.

What is claimed is:

1. A method of reading data in a ferroelectric memory device, comprising:
    applying a read voltage to a ferroelectric capacitor; and
    detecting a voltage that reflects an amount of a dynamic change in capacitance of the ferroelectric capacitor to which the read voltage is applied,
    the ferroelectric capacitor stores one of first data and second data, the first data being stored based on spontaneous polarization of a first polarity when a voltage applied to the ferroelectric capacitor is returned from a write voltage of the first polarity to 0 V, the second data being stored based on spontaneous polarization of a second polarity when the voltage applied to the ferroelectric capacitor is returned from a write voltage of the second polarity to 0 V, and
    polarity of polarization of the ferroelectric capacitor which has stored the first data is not reversed, and polarity of polarization of the ferroelectric capacitor which has stored the second data is reversed, when a voltage of the first polarity is applied to the ferroelectric capacitor as the read voltage.

2. The method of reading data in a ferroelectric memory device as defined in claim 1,
    wherein the voltage that reflects the amount of the dynamic change is detected when the read voltage is applied to the ferroelectric capacitor which has stored the second data, around a time at which the polarization of the ferroelectric capacitor becomes zero in a hysteresis characteristic between polarization and an applied voltage of the ferroelectric capacitor.

3. The method of reading data in a ferroelectric memory device as defined in claim 1,
    wherein the dynamic change in the capacitance of the ferroelectric capacitor which has stored the second data is greater than the dynamic change in the capacitance of the ferroelectric capacitor which has stored the first data, when a voltage of the first polarity is applied to the ferroelectric capacitor as the read voltage.

4. A method of reading data in a ferroelectric memory device, comprising:
    applying a read voltage to a ferroelectric capacitor; and
    detecting a voltage that reflects an amount of a dynamic change in capacitance of the ferroelectric capacitor to which the read voltage is applied,
    a voltage-rise curve includes a portion in which a voltage-rise gradient differs depending on whether a polarization value of the ferroelectric capacitor is a first value or a second value, the voltage-rise curve indicating a voltage rise of a sense line connected with the ferroelectric capacitor when the read voltage is applied to the ferroelectric capacitor, and a timing of detecting the voltage that reflects the amount of the dynamic change is set in a period specified by the portion in which the voltage-rise gradient differs.

5. A ferroelectric memory device comprising:
    voltage applying section which applies a read voltage to a ferroelectric capacitor; and
    voltage detection section which detects a voltage that reflects an amount of a dynamic change in capacitance of the ferroelectric capacitor to which the read voltage is applied, a voltage-rise curve includes a portion in which a voltage-rise gradient differs depending on whether a polarization value of the ferroelectric capacitor is a first value or a second value, the voltage-rise curve indicating a voltage rise of a sense line connected with the ferroelectric capacitor when the read voltage is applied to the ferroelectric capacitor, and a timing of detecting the voltage that reflects the amount of the dynamic change by the voltage detection section is set in a period specified by the portion in which the voltage-rise gradient differs.

6. A ferroelectric memory device comprising:
    a plurality of memory cells, each of the memory cells including a ferroelectric capacitor and a switching element;
    a plurality of wordlines, each of the wordlines extending in a first direction and being connected in common with a control terminal of the switching element in each of the memory cells arranged along the first direction;
    a plurality of bitlines, each of the bitlines extending in a second direction and being connected in common with one end of the switching element in each of the memory cells arranged along the second direction, the second direction intersecting the first direction;
    a plurality of sense lines, each of the sense lines extending in the second direction and being connected in common with one end of the ferroelectric capacitor and the other end of the switching element in each of the memory cells arranged in the second direction;
    a plurality of plate lines, each of the plate lines extending in the first direction and being connected in common with the other end of the ferroelectric capacitor in each of the memory cells arranged in the first direction; and
    a voltage detection section which detects a voltage of the sense lines in a specified period, when a read voltage is applied to the ferroelectric capacitor of at least one selected memory cell selected from among the plurality of memory cells, the specified period being specified by a portion of a voltage-rise curve in which a voltage-rise gradient differs depending on whether a polarization value of the ferroelectric capacitor is a first value or a second value, and the voltage-rise curve indicating a voltage rise of one of the sense lines connected with the ferroelectric capacitor of the selected memory cell.

7. The ferroelectric memory device as defined in claim 6, further comprising:
a read timing generation device which generates a timing signal for setting a period for detecting the voltage of the sense lines,
wherein the voltage detection section includes a plurality of sense amplifiers connected with the sense lines, and
wherein the read timing generation device activates the sense amplifiers by outputting the timing signal to the sense amplifiers.

8. The ferroelectric memory device as defined in claim 7, wherein each of the sense amplifiers activated for a predetermined period of time by the timing signal compares a cell voltage from one of the sense lines with a reference voltage.

9. The ferroelectric memory device as defined in claim 6, wherein, when reading or writing data, the switching element in the selected memory cell is turned on by applying a selected-wordline voltage to a selected wordline which is a wordline among the plurality of the wordlines and to be used for selecting the selected memory cell, and the switching element in an unselected memory cell among the plurality of the memory cells is turned off by applying an unselected-wordline voltage to an unselected wordline which is a wordline other than the selected wordline among the plurality of the wordlines, and
wherein a read plate-line voltage or a write plate-line voltage is applied to a selected plate line which is a plate line among the plurality of the plate lines and connected with the selected memory cell, and an unselected plate line, which is a plate line other than the selected plate line among the plurality of the plate lines, is set in a floating state.

10. The ferroelectric memory device as defined in claim 9,
wherein, when writing data "1", a data "1" write bitline voltage is applied to a selected bitline which is a bitline among the plurality of bitlines and connected with the selected memory cell, an unselected-bitline voltage is applied to an unselected bitline which is a bitline other than the selected bitline among the plurality of the bitlines, and a data "1" write plate-line voltage is applied to the selected plate line.

11. The ferroelectric memory device as defined in claim 9,
wherein, when writing data "0", a data "0" write bitline voltage is applied to a selected bitline which is a bitline among the plurality of bitlines and connected with the selected memory cell, an unselected-bitline voltage is applied to an unselected bitline which is a bitline other than the selected bitline among the plurality of the bitlines, and a data "0" write plate-line voltage is applied to the selected plate line.

12. The ferroelectric memory device as defined in claim 6,
wherein, when reading data, a read bitline voltage is applied to a selected bitline which is a bitline among the plurality of bitlines and connected with the selected memory cell, and an unselected-bitline voltage is applied to an unselected bitline which is a bitline other than the selected bitline among the plurality of the bitlines.

* * * * *